US012586766B2

(12) United States Patent　　　　(10) Patent No.:　US 12,586,766 B2
Li et al.　　　　　　　　　　　　　(45) Date of Patent:　　Mar. 24, 2026

(54) ELECTRODE FIXING ASSEMBLY AND DRY ETCHING DEVICE

(71) Applicant: SHENZHEN CHINA STAR OPTOELECTRONICS SEMICONDUCTOR DISPLAY TECHNOLOGY CO., LTD., Shenzhen (CN)

(72) Inventors: Zhiyuan Li, Shenzhen (CN); Xianfu Zeng, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 947 days.

(21) Appl. No.: 17/787,689

(22) PCT Filed: May 24, 2022

(86) PCT No.: PCT/CN2022/094683
§ 371 (c)(1),
(2) Date: Jun. 21, 2022

(87) PCT Pub. No.: WO2023/216318
PCT Pub. Date: Nov. 16, 2023

(65) Prior Publication Data
US 2024/0186120 A1　　Jun. 6, 2024

(30) Foreign Application Priority Data

May 12, 2022　(CN) ......................... 202210520435.3

(51) Int. Cl.
*H01J 37/32*　　　　(2006.01)

(52) U.S. Cl.
CPC .... *H01J 37/32568* (2013.01); *H01J 37/3255* (2013.01); *H01J 37/32559* (2013.01); *H01J 2237/032* (2013.01); *H01J 2237/334* (2013.01)

(58) Field of Classification Search
CPC ............. H01J 37/32568; H01J 37/3255; H01J 37/32559; H01J 2237/032; H01J 2237/334
See application file for complete search history.

(56) References Cited

U.S. PATENT DOCUMENTS

2005/0173569 A1*　8/2005　Noorbakhsh ..... C23C 16/45565
　　　　　　　　　　　　　　　　　　　　239/690
2007/0158026 A1*　7/2007　Amikura ........... H01L 21/67109
　　　　　　　　　　　　　　　　　　　　118/724

(Continued)

FOREIGN PATENT DOCUMENTS

CN　　102154630　A　　8/2011
CN　　210607176　U　　5/2020

(Continued)

OTHER PUBLICATIONS

PCT International Search Report for International Application No. PCT/CN2022/094683, mailed on Nov. 28, 2022, 8pp.

(Continued)

*Primary Examiner* — Yuechuan Yu
(74) *Attorney, Agent, or Firm* — The Roy Gross Law Firm, LLC; Roy D. Gross

(57) ABSTRACT

The present disclosure provides an electrode fixing assembly and a dry etching device. The electrode fixing assembly includes a first fixing element and a second fixing element, wherein a hardness of a material of the first fixing element is greater than a hardness of a material of the second fixing element. The electrode fixing assembly is configured to be arranged in the dry etching device to fix an upper electrode on a device body, a generation of particles is reduced or (Continued)

110 eliminated, and then problems such as poor etching or the like caused by a substrate to be etched covered by the particles are avoided.

20 Claims, 4 Drawing Sheets

(56) References Cited

U.S. PATENT DOCUMENTS

2010/0136216 A1\*  6/2010  Tsuei ................ C23C 16/45565
                                                      427/9
2014/0116338 A1\*  5/2014  He .......................... C23C 14/06
                                                      118/723 R
2021/0403337 A1  12/2021  Beaudry et al.

FOREIGN PATENT DOCUMENTS

CN         111415855  A    7/2020
CN         114284127  A    4/2022
JP        2008028022  A    2/2008

OTHER PUBLICATIONS

PCT Written Opinion of the International Search Authority for International Application No. PCT/CN2022/094683, mailed on Nov. 28, 2022, 7pp.
Chinese Office Action issued in corresponding Chinese Patent Application No. 202210520435.3 dated Nov. 22, 2024, pp. 1-7, 15pp.

\* cited by examiner

110

10

10

11

14 { 141
     142

20

25    22

B    B

201

202

20

110

ELECTRODE FIXING ASSEMBLY AND DRY ETCHING DEVICE

CROSS REFERENCE TO RELATED APPLICATIONS

This application is a National Phase of PCT Patent Application No. PCT/CN2022/094683 having International filing date of May 24, 2022, which claims the benefit of priority of Chinese Patent Application No. 202210520435.3, filed May 12, 2022, the contents of which are all incorporated herein by reference in their entirety.

FIELD OF INVENTION

The present disclosure relates to a field of etching technology, and particularly relates to an electrode fixing assembly and a dry etching device.

BACKGROUND OF INVENTION

In a field of display technology, a substrate is generally etched by a dry etching process to manufacture a corresponding pattern. Specifically, a substrate to be etched is placed in a dry etching device, and a material to be etched on the substrate is removed by plasma discharge for etching.

The dry etching device mainly includes a device body, an upper electrode and a lower electrode located in a reaction chamber of the device body, and an abutment located on the lower electrode for placing the substrate. When in specific implementations, the substrate to be etched is placed on the abutment above the lower electrode, plasma gases are introduced into the reaction chamber, the reaction chamber is sealed, and a voltage is applied to the upper electrode and the lower electrode to form a potential difference between them, thereby promoting plasma to move towards the substrate and etch the substrate.

Technical Problems

In a dry etching device, an electrode fixing holder is generally arranged between a device body and an upper electrode. When the upper electrode, the electrode fixing holder, and the device body are fixedly connected, the upper electrode fixed on the device body may be realized. However, in an existing dry etching device, when friction occurs between the electrode fixing holder and the device body, surfaces of the electrode fixing holder are easily worn, resulting in a generation of particles, and the particles may pollute environment in a reaction chamber. When the particles fall onto the substrate, a part covered by the particles on the substrate may not be etched by plasma, thereby resulting in poor etching, a decrease in product yield, and an increase in production costs.

Technical Solutions

The embodiments of the present disclosure provide an electrode fixing assembly and a dry etching device, when friction occurs between an electrode fixing holder and a device body, surfaces of the electrode fixing assembly are not easily worn, therefore a generation of particles may be reduced or eliminated, and then problems such as poor etching or the like caused by a substrate to be etched covered by the particles are avoided, product yield may be improved, and production costs are reduced.

First aspect, an embodiment of the present disclosure provides an electrode fixing assembly, including a first fixing element and a second fixing element, wherein a hardness of a material of the first fixing element is greater than a hardness of a material of the second fixing element;

the electrode fixing assembly is configured to be arranged in a dry etching device to fix an upper electrode on a device body, the first fixing element and the second fixing element are arranged between the upper electrode and the device body, wherein a side of the first fixing element away from the second fixing element is arranged towards the device body, and a side of the second fixing element away from the first fixing element is arranged towards the upper electrode.

In some embodiments, the material of the second fixing element includes aluminum, and the material of the first fixing element includes a metal material with a hardness greater than a hardness of the aluminum.

In some embodiments, the material of the first fixing element includes at least one of iron, ferroalloy, tungsten, tungsten alloy, vanadium, vanadium alloy, manganese, manganese alloy, iridium, iridium alloy, molybdenum, molybdenum alloy, cobalt, cobalt alloy, zirconium, zirconium alloy, beryllium, beryllium alloy, titanium, titanium alloy, chromium, chromium alloy, tantalum, tantalum alloy, nickel, nickel alloy, niobium, and niobium alloy.

In some embodiments, a ratio of a thickness of the first fixing element to a thickness of the second fixing element is (1-5):(8-12).

In some embodiments, a protective layer is arranged on an outer surface of the second fixing element.

In some embodiments, a material of the protective layer comprises yttrium oxide.

In some embodiments, a first installation hole is defined on the first fixing element, a second installation hole is defined on the second fixing element, and the first installation hole is arranged corresponding to the second fixing installation hole.

In some embodiments, fourth installation holes are defined on the first fixing element, fifth installation holes are defined on the second fixing element, and the fourth installation holes are arranged corresponding to the fifth installation holes.

In some embodiments, a thickness of the first fixing element ranges from 1 mm to 5 mm.

In some embodiments, a thickness of the second fixing element ranges from 8 mm to 12 mm.

Second aspect, an embodiment of the present disclosure provides a dry etching device, including:

a device body, having an inner cavity;

an upper electrode, arranged in the inner cavity of the device body;

an electrode fixing assembly, the electrode fixing assembly is as described above, the electrode fixing assembly is arranged in the inner cavity of the device body, the upper electrode and the electrode fixing assembly are connected with the device body, and the first fixing element and the second fixing element are arranged between the upper electrode and the device body, wherein the side of the first fixing element away from the second fixing element is arranged towards the device body, and the side of the second fixing element away from the first fixing element is arranged towards the upper electrode; and a lower electrode, arranged in the inner cavity of the device body, the lower electrode is arranged opposite to the upper electrode.

In some embodiments, a first installation hole is defined on the first fixing element, a second installation hole is defined on the second fixing element, and third installation holes are defined on the device body, the first installation hole and the second installation hole are arranged corresponding to the third installation holes, and the first fixing element, the second fixing element, and the device body are fixedly connected by first fasteners penetrating through the first installation hole, the second installation hole, and the third installation holes.

In some embodiments, fourth installation holes are defined on the first fixing element, fifth installation holes are defined on the second fixing element, and sixth installation holes are defined on the upper electrode, the fourth installation holes and the fifth installation holes are arranged corresponding to the sixth installation holes, and the first fixing element, the second fixing element, and the upper electrode are fixedly connected by second fasteners penetrating through the fourth installation holes, the fifth installation holes, and the sixth installation holes.

In some embodiments, the material of the second fixing element comprises aluminum, and the material of the first fixing element comprises a metal material with a hardness greater than a hardness of the aluminum.

In some embodiments, the material of the first fixing element comprises at least one of iron, ferroalloy, tungsten, tungsten alloy, vanadium, vanadium alloy, manganese, manganese alloy, iridium, iridium alloy, molybdenum, molybdenum alloy, cobalt, cobalt alloy, zirconium, zirconium alloy, beryllium, beryllium alloy, titanium, titanium alloy, chromium, chromium alloy, tantalum, tantalum alloy, nickel, nickel alloy, niobium, and niobium alloy.

In some embodiments, a ratio of a thickness of the first fixing element to a thickness of the second fixing element is (1-5):(8-12).

In some embodiments, a protective layer is arranged on an outer surface of the second fixing element.

In some embodiments, a material of the protective layer comprises yttrium oxide.

In some embodiments, a thickness of the first fixing element ranges from 1 mm to 5 mm.

In some embodiments, a thickness of the second fixing element ranges from 8 mm to 12 mm.

Beneficial Effects

An electrode fixing assembly provided by the embodiments of the present disclosure may be applied to a dry etching device instead of a traditional electrode fixing holder to fix an upper electrode on a device body. In the electrode fixing assembly, since a hardness of a material of a first fixing element is greater than a hardness of a material of a second fixing element, and the first fixing element is arranged towards the device body. That is to say, a part with a greater hardness in the electrode fixing assembly is arranged to be in contact with the device body. Since the hardness of the material of the first fixing element is greater, and wear resistance is better, therefore, when friction occurs between the first fixing element and the device body, surfaces of the first fixing element are not easily worn, thereby a generation of particles is reduced or eliminated, and then problems such as poor etching or the like caused by a substrate to be etched covered by the particles are avoided, product yield is improved, and production costs are reduced.

DESCRIPTION OF DRAWINGS

To describe the technical solutions of the embodiments of the present disclosure more clearly, the following briefly introduces the accompanying drawings used in the description of the embodiments of the present disclosure. The accompanying drawings described below illustrate only some exemplary embodiments of the present disclosure, and persons skilled in the art may derive other drawings from the drawings without making creative efforts.

DETAILED DESCRIPTION OF EMBODIMENTS

The technical solutions in the embodiments of the present disclosure will be described clearly and completely hereafter with reference to the accompanying drawings. Apparently, the described embodiments are only a part of but not all embodiments of the present disclosure. All other embodiments obtained by persons of ordinary skill in the art based on the embodiments of the present disclosure without creative efforts shall fall within the protection scope of the present disclosure.

Figure 1:
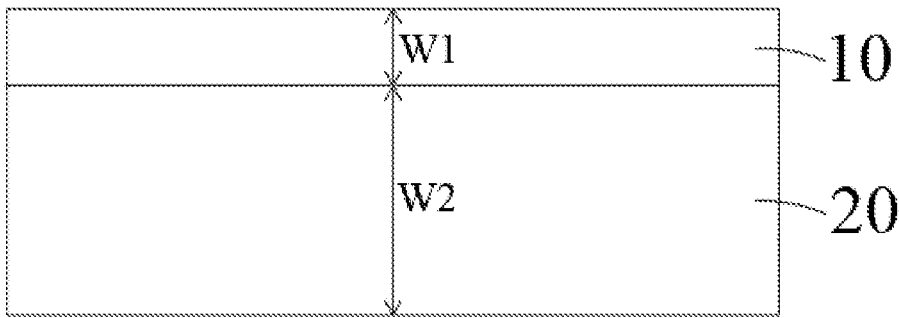
FIG. 1 is a side view schematic diagram of an electrode fixing assembly provided by an embodiment of the present disclosure.

Referring to FIG. 1, FIG. 1 is a side view schematic diagram of an electrode fixing assembly provided by an embodiment of the present disclosure. The present disclosure provides an electrode fixing assembly 110 including a first fixing element 10 and a second fixing element 20, wherein a hardness of a material of the first fixing element 10 is greater than a hardness of a material of the second fixing element 20.

Figure 7:
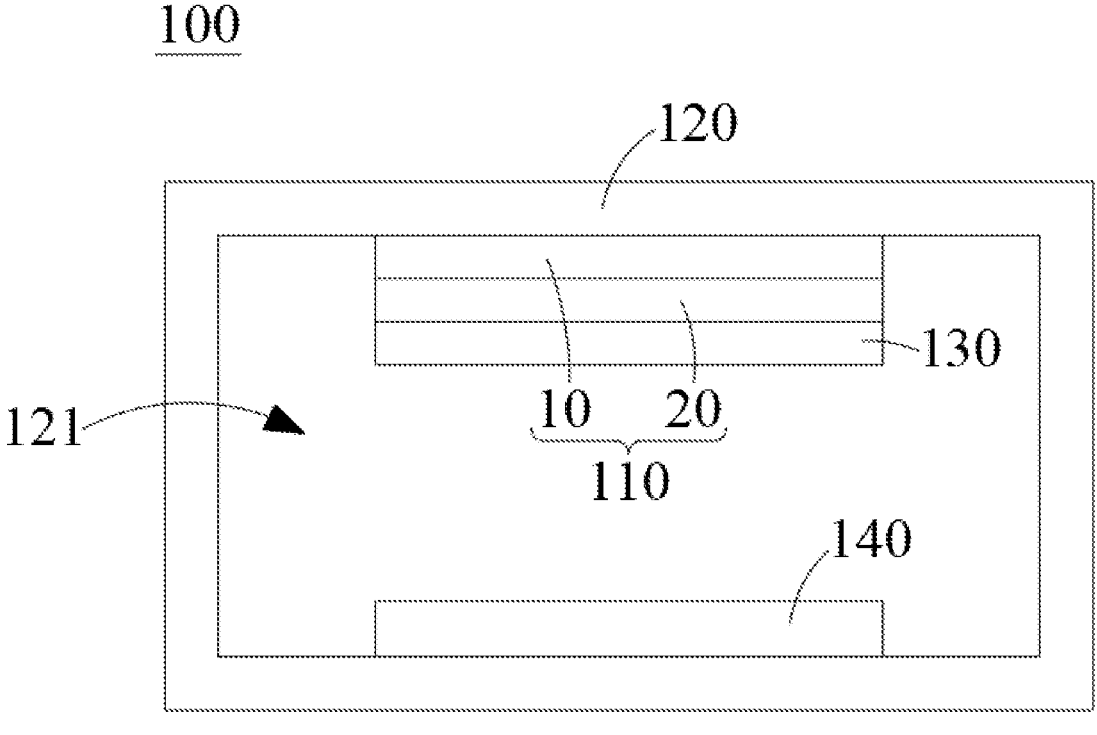
FIG. 7 is a schematic structural diagram of a dry etching device provided by an embodiment of the present disclosure.

Referring to FIG. 7, FIG. 7 FIG. 7 is a schematic structural diagram of a dry etching device provided by an embodiment of the present disclosure. The electrode fixing assembly 110 is configured to be arranged in a dry etching device to fix an upper electrode 130 on a device body 120. The first fixing element 10 and the second fixing element 20 are arranged between the upper electrode 130 and the device body 120. Wherein a side of the first fixing element 10 away from the second fixing element 20 is arranged towards the device body 120, and a side of the second fixing element 20 away from the first fixing element 10 is arranged towards the upper electrode 130.

The electrode fixing assembly 110 provided by the embodiments of the present disclosure may be applied to the dry etching device instead of a traditional electrode fixing holder to fix the upper electrode 130 on the device body 120. In the electrode fixing assembly 110, since the hardness of the material of the first fixing element 10 is greater than the hardness of the material of the second fixing element 20, and the first fixing element 10 is arranged towards the device body 120, that is to say, a part with a greater hardness in the electrode fixing assembly 110 is arranged to be in contact with the device body 120. Since the hardness of the material of the first fixing element 10 is greater, and wear resistance is better, therefore, when friction occurs between the first fixing element 10 and the device body 120, surfaces of the first fixing element 10 are not easily worn, thereby reducing or eliminating a generation of particles, and then problems such as poor etching or the like caused by a substrate to be etched covered by the particles are avoided, product yield is improved, and production costs are reduced.

Illustratively, the material of the second fixing element 20 includes aluminum, and the material of the first fixing element 10 includes a metal material with a hardness greater than a hardness of the aluminum.

Illustratively, the material of the first fixing element 10 includes at least one of iron, ferroalloy, tungsten, tungsten alloy, vanadium, vanadium alloy, manganese, manganese alloy, iridium, iridium alloy, molybdenum, molybdenum alloy, cobalt, cobalt alloy, zirconium, zirconium alloy, beryllium, beryllium alloy, titanium, titanium alloy, chromium, chromium alloy, tantalum, tantalum alloy, nickel, nickel alloy, niobium, and niobium alloy.

In some embodiments, the material of the first fixing element 10 may be ferroalloys, such as stainless steel, wherein SUS316 stainless steel has advantages of greater hardness, wear resistance, corrosion resistance, etc., which may significantly improve wear resistance of the first fixing element 10 and prevent the particles from being generated when the friction occurs between the first fixing element 10 and the device body 120.

Illustratively, a ratio of a thickness W1 of the first fixing element 10 to a thickness W2 of the second fixing element 20 is (1-5):(8-12), such as 1:10, 2:10, 3:10, 4: 10, 5:10, 3:8, 3:9, 3:11, 3: 12, 1:8, 1: 12, 5:8, 5:12, etc. It should be understood that since a cost of the material of the first fixing element 10 is relatively higher, and a cost of the material of the second fixing element 20 is relatively lower, therefore, by setting the thickness W1 of the first fixing element 10 to a smaller thickness, and setting the thickness of the material of the second fixing element 20 to a greater thickness, the production costs may be reduced to a greatest extent while ensuring that the electrode fixing assembly 110 has better mechanical strength.

Illustratively, the thickness W1 of the first fixing element 10 ranges from 1 mm to 5 mm, such as 1 mm, 2 mm, 3 mm, 4 mm, 5 mm, etc.

Illustratively, the thickness W2 of the second fixing element 20 ranges from 8 mm to 12 mm, such as 8 mm, 9 mm, 10 mm, 11 mm, 12 mm, etc.

In some embodiments, the thickness W1 of the first fixing element 10 is 3 mm, and the thickness W2 of the second fixing element 20 is 10 mm, that is, a total thickness of the electrode fixing assembly 110 is 13 mm.

Illustratively, a protective layer (not shown in figures) is arranged on an outer surface of the second fixing element 20. Illustratively, the material of the second fixing element 20 may include metal materials such as aluminum, etc. When the second fixing element 20 is an aluminum material, the aluminum material may be anodized to form an oxide film. That is to say, the second fixing element 20 includes the aluminum material and the oxide film (alumina) located on an outer surface of the aluminum material. Since both the aluminum material and the oxide film easily react with process gases ($NF_3$), resulting in that the second fixing element 20 is corroded to generate the particles, when the particles fall onto the substrate to be etched, the problems such as the poor etching or the like may also occur. Therefore, the embodiments of the present disclosure may prevent the second fixing element 20 from being corroded and generating the particles by arranging the protective layer on the outer surface of the second fixing element 20.

Illustratively, a material of the protective layer includes yttrium oxide ($Y_2O_3$). Yttrium oxide does not react with the process gases (such as $NF_3$, etc.) due to its relatively stable chemical properties. Therefore, the second fixing element 20 may be effectively protected to prevent the second fixing element 20 from being corroded to generate the particles, and occurrences of the problems such as the poor etching or the like are further reduced.

It should be noted that, in traditional dry etching devices, the electrode fixing holder for fixing the upper electrode is generally the aluminum material. The aluminum material not only easily rubs against the device body, resulting in the generation of the particles (a first source of the particles), but the outer surface of the aluminum material also easily reacts with the process gases (such as $NF_3$, etc.), resulting in the generation of the particles (a second source of the particles). By replacing the traditional electrode fixing holder with the electrode fixing assembly 110 including the first fixing element 10 and the second fixing element 20 in the embodiments of the present disclosure, since a part in contact with the device body 120 in the electrode fixing assembly 110 is the first fixing element 10, and the hardness of the material of the first fixing element 10 is greater and the wear resistance is better, therefore, when the friction occurs between the first fixing element 10 and the device body 120, the surfaces of the first fixing element 10 is not easily worn, thereby eliminating the first source of the particles. In addition, the embodiments of the present disclosure may effectively protect the second fixing element 20 by arranging the protective layer on the outer surface of the second fixing element 20 to prevent the outer surface of the second fixing element 20 from being corroded and resulting in the particles, thereby eliminating the second source of the particles. That is to say, the embodiments of the present disclosure eliminate or reduce the generation of the particles through two ways, thereby the occurrences of the problems such as the poor etching or the like are eliminated or reduced.

Referring to FIG. 2 to FIG. 6, a first installation hole 11 is defined on the first fixing element 10, a second installation hole 22 is defined on the second fixing element 20, and third installation holes may be defined on the device body 120. The first installation hole 11 and the second installation hole 22 are arranged corresponding to the third installation holes. The first fixing element 10, the second fixing element 20, and the device body 120 are fixedly connected by first fasteners penetrating through the first installation hole 11, the second installation hole 22, and the third installation holes, thereby realizing a fixed connection between the electrode fixing assembly 110 and the device body 120 of the dry etching device 100.

Illustratively, the first fasteners may be screws. In some embodiments, internal threads may be arranged on hole walls of the third installation holes on the device body, the first installation hole 11 on the first fixing element 10, and the second installation hole 22 on the second fixing element 20. In addition, when the device body 120, the first fixing element 10, and the second fixing element 20 are arranged in sequence, the internal threads on the hole walls of the third installation holes, the first installation hole 11, and the second installation hole 22 are in a continuous state and are matched with external threads of the screws. In other embodiments, the internal threads are not arranged on the hole walls of the third installation holes on the device body 120, and the third installation holes are smooth holes. The internal threads are arranged on the hole walls of the first installation hole 11 and the second installation hole 22, are in the continuous state, and are matched with external threads of the screws. In other embodiments, the internal threads are not arranged on the hole walls of the third installation holes on the device body 120 and the first installation hole 11 on the first fixing element 10, both the third installation holes and the first installation hole 11 are the smooth holes. The internal threads are arranged on the hole walls of the second installation hole 22 on the second fixing element 20 and are matched with the external threads of the screws.

Referring to FIG. 2 to FIG. 6, fourth installation holes 14 are also defined on the first fixing element 10, fifth installation holes 25 are also defined on the second fixing element 20, and sixth installation holes may be defined on the upper electrode 130. The fourth installation holes 14 and the fifth installation holes 25 are arranged corresponding to the sixth installation holes. The first fixing element 10, the second fixing element 20, and the upper electrode 130 are fixedly connected by second fasteners penetrating through the fourth installation holes 14, the fifth installation holes 25, and the sixth installation holes, thereby realizing a fixed connection between the electrode fixing assembly 110 and the upper electrode 130.

Figure 3:
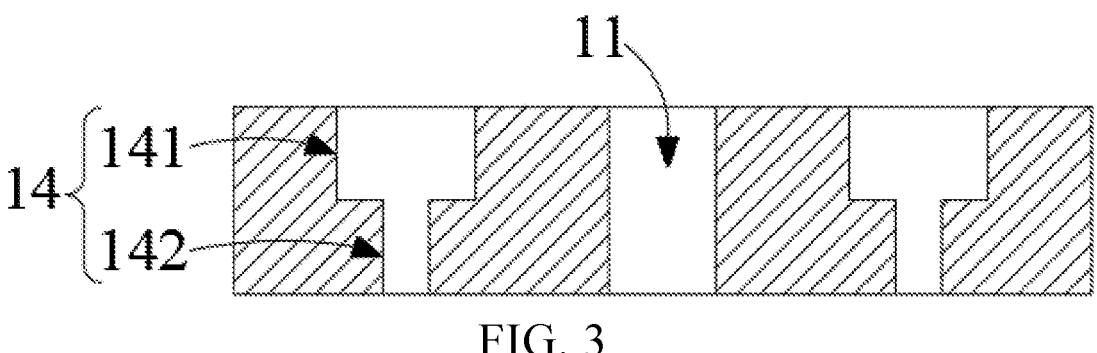
FIG. 3 is a cross-sectional schematic diagram of the first fixing element of FIG. 2 along a direction A-A.

Referring to FIG. 3, the fourth installation holes 14 may include first through-holes 141 and second through-holes 142 penetrating each other, wherein diameters of the first through-holes 141 are greater than diameters of the second through-holes 142, and the diameters of the second through-holes 142 are same as diameters of the fifth installation holes 25 and diameters of the sixth installation holes. When the second fasteners are the screws, heads of the screws may be accommodated in the first through-holes 141, and threads of the screws may pass through the second through-holes 142, the fifth installation holes 25, and the sixth installation holes to fix the first fixing element 10, the second fixing element 20, and the upper electrode 130. Since the heads of the screws may be accommodated in the first through-holes 141, that is to say, the heads of the screws do not protrude an outer surface of the electrode fixing assembly 110, therefore, flatness of the outer surface of the electrode fixing assembly 110 may be maintained, thereby stability of the fixed connection between the electrode fixing assembly 110 and the device body 120 of the dry etching device is not affected.

Figure 2:
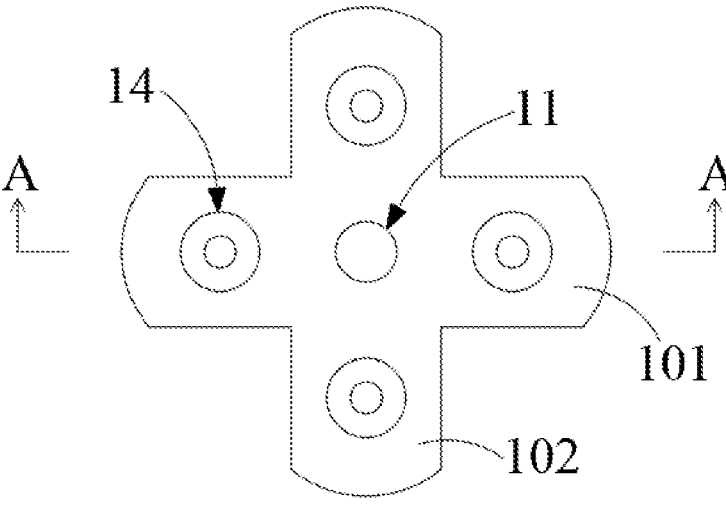
FIG. 2 is a top view schematic diagram of a first fixing element provided by an embodiment of the present disclosure.

Referring to FIG. 2, the first fixing element 10 may include a first transverse part 101 and a first longitudinal part 102 connected with each other, and the first transverse part 101 and the first longitudinal part 102 are arranged crosswise. Illustratively, the first installation hole 11 is defined at an intersection of the first transverse part 101 and the first longitudinal part 102. The fourth installation holes 14 may be defined at both ends of the first transverse part 101, and the fourth installation holes 14 may be defined at both ends of the first longitudinal part 102, that is to say, four of the fourth installation holes 14 may be defined on the first fixing element 10. Illustratively, the first transverse part 101 and the first longitudinal part 102 are perpendicular to each other. The fourth installation holes 14 are defined at both ends of the first transverse part 101 and both ends of the first longitudinal part 102 in the embodiments of the present disclosure, that is to say, the fourth installation holes 14 are defined at four top ends of a cross-shaped structure of the first fixing element 10. Since the fourth installation holes 14 are used to realize the fixed connection between the electrode fixing assembly 110 and the upper electrode, stability of connection between the electrode fixing assembly 110 and the upper electrode 130 may be significantly improved.

Figure 4:
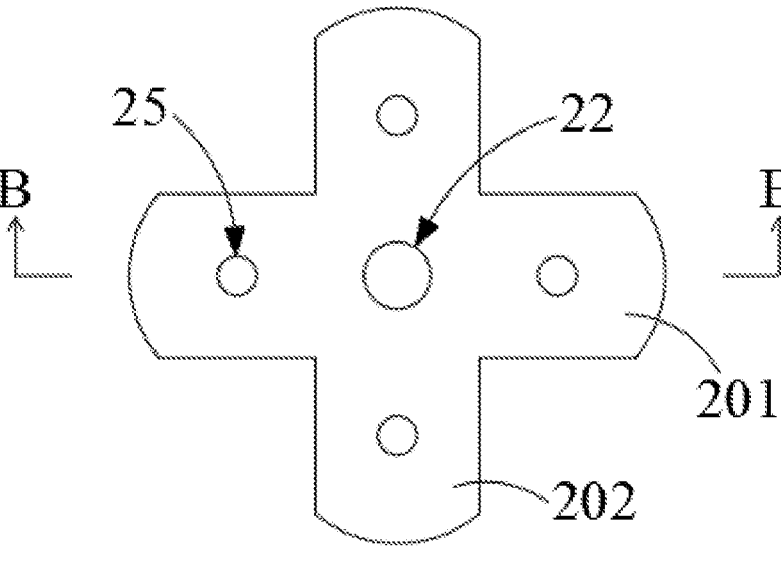
FIG. 4 is a top view schematic diagram of a second fixing element provided by an embodiment of the present disclosure.
Figure 5:
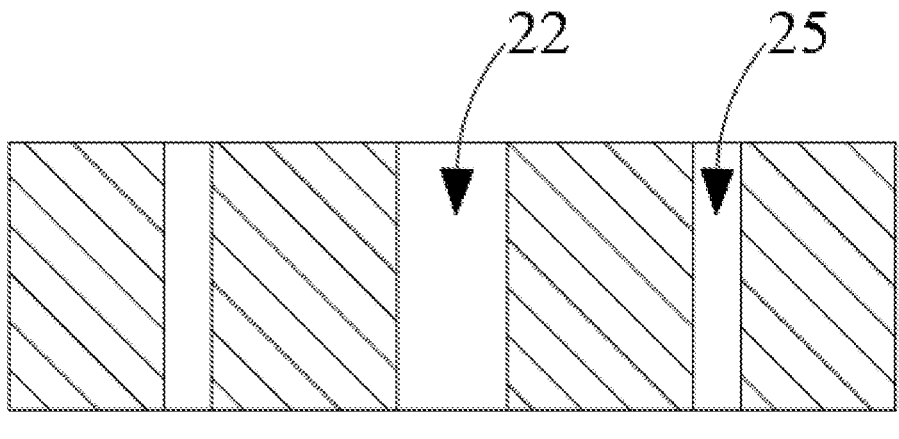
FIG. 5 is a cross-sectional schematic diagram of the second fixing element of FIG. 4 along a direction B-B.
Figure 6:
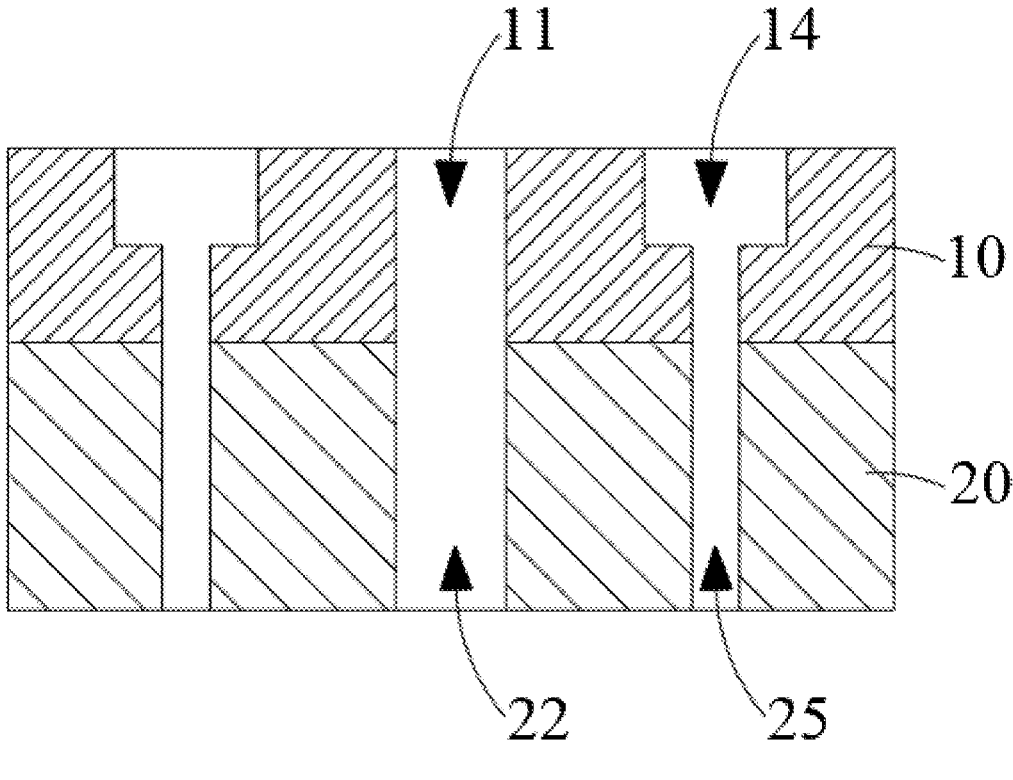
FIG. 6 is a cross-sectional schematic diagram of an electrode fixing assembly provided by an embodiment of the present disclosure.

Referring to FIG. 4, the second fixing element 20 may include a second transverse part 201 and a second longitudinal part 202 connected with each other, and the second transverse part 201 and the second longitudinal part 202 are arranged crosswise. Illustratively, the second installation hole 22 is defined at an intersection of the second transverse part 201 and the second longitudinal part 202. The fifth installation holes 25 may be defined at both ends of the second transverse part 201, and the fifth installation holes 25 may be defined at both ends of the second longitudinal part 202, that is to say, four of the fifth installation holes 25 may be defined on the second fixing element 20. Illustratively, the second transverse part 201 and the second longitudinal part 202 are perpendicular to each other.

Referring to FIG. 7, FIG. 7 is a schematic structural diagram of a dry etching device provided by an embodiment of the present disclosure. The present disclosure further provides the dry etching device 100 including the device body 120, the upper electrode 130, and the electrode fixing assembly 110, wherein the electrode fixing assembly 110 may be the electrode fixing assembly 110 in any of the above embodiments.

Wherein the device body 120 includes an inner cavity 121, both the upper electrode 130 and the electrode fixing assembly 110 are arranged in the inner cavity 121 of the device body 120. The upper electrode 130 and the electrode fixing assembly 110 are connected with the device body 120, and the first fixing element 10 and the second fixing element 20 are arranged between the upper electrode 130 and the device body 120. Wherein the side of the first fixing element 10 away from the second fixing element 20 is arranged towards the device body 120, and the side of the second fixing element 20 away from the first fixing element 10 is arranged towards the upper electrode 130.

Illustratively, the dry etching device 100 further includes a lower electrode 140, the lower electrode 140 is arranged in the inner cavity 121 of the device body 120 and is arranged opposite to the upper electrode 130.

It may be understood that a working principle of the dry etching device 100 is: placing the substrate to be etched on the lower electrode 140, introducing plasma gases into the inner cavity 121, and applying a voltage to the upper electrode 130 and the lower electrode 140 to form a potential difference between the upper electrode 130 and the lower electrode 140, thereby promoting plasma to move towards the substrate and etch the substrate. In the dry etching device 100 of the embodiments of the present disclosure, since the particles are not easily generated on the surfaces of the electrode fixing assembly 110, therefore, the problems such as the poor etching or the like caused by the substrate to be etched covered by the particles are avoided, the product yield is improved, and the production costs are reduced.

Combine FIG. 2 to FIG. 7, the first installation hole 11 is defined on the first fixing element 10, the second installation hole 22 is defined on the second fixing element 20, and the third installation holes may be defined on the device body 120. The first installation hole 11 and the second installation hole 22 are arranged corresponding to the third installation holes. The first fixing element 10, the second fixing element 20, and the device body 120 are fixedly connected by the first fasteners penetrating through the first installation hole 11, the second installation hole 12, and the third installation holes, thereby realizing the fixed connection between the electrode fixing assembly 110 and the device body 120 of the dry etching device 100. Illustratively, the first fasteners may be the screws.

Combine FIG. 2 to FIG. 7, the fourth installation holes 14 are defined on the first fixing element 10, the fifth installation holes 25 are defined on the second fixing element 20, and the sixth installation holes are defined on the upper electrode 130. The fourth installation holes 14 and the fifth installation holes 25 are arranged corresponding to the sixth installation holes, and the first fixing element 10, the second fixing element 20, and the upper electrode 130 are fixedly connected by the second fasteners penetrating through the fourth installation holes 14, the fifth installation holes 25, and the sixth installation holes, thereby realizing the fixed connection between the electrode fixing assembly 110 and the upper electrode 130. Illustratively, the second fasteners may be the screws.

Referring to FIG. 3, the fourth installation holes 14 include the first through-holes 141 and the second through-holes 142 penetrating each other, wherein the diameters of the first through-holes 141 are greater than the diameters of the second through-holes 142, and the diameters of the second through-holes 142 are the same as the diameters of the fifth installation holes 25 and the diameters of the sixth installation holes. When the second fasteners are the screws, the heads of the screws may be accommodated in the first through-holes 141, and the threads of the screws may pass through the second through-holes 142, the fifth installation holes 25, and the sixth installation holes to fix the first fixing element 10, the second fixing element 20, and the upper electrode 130. Since the heads of the screws may be accommodated in the first through-holes 141, that is to say, the heads of the screws do not protrude the outer surface of the electrode fixing assembly 110, therefore, the flatness of the outer surface of the electrode fixing assembly 110 may be maintained, thereby the stability of the fixed connection between the electrode fixing assembly 110 and the device body 120 of the dry etching device is not affected.

Illustratively, when installing the upper electrode 130 on the device body 120, the first fixing element 10, the second fixing element 20, and the upper electrode 130 may be fixedly connected with the second fasteners first, and then the first fixing element 10, the fixing element 20, and the device body 120 may be fixedly connected with the first fasteners.

Illustratively, the material of the second fixing element 20 includes aluminum, and the material of the first fixing element 10 includes the metal material with the hardness greater than the hardness of the aluminum.

Illustratively, the material of the first fixing element 10 includes at least one of iron, ferroalloy, tungsten, tungsten alloy, vanadium, vanadium alloy, manganese, manganese alloy, iridium, iridium alloy, molybdenum, molybdenum alloy, cobalt, cobalt alloy, zirconium, zirconium alloy, beryllium, beryllium alloy, titanium, titanium alloy, chromium, chromium alloy, tantalum, tantalum alloy, nickel, nickel alloy, niobium, and niobium alloy.

Illustratively, the ratio of the thickness W1 of the first fixing element 10 to the thickness W2 of the second fixing element 20 is (1-5): (8-12).

Illustratively, the protective layer is arranged on the outer surface of the second fixing element 20. Illustratively, the material of the second fixing element 20 may include metal materials such as aluminum, etc. When the second fixing element 20 is the aluminum material, the aluminum material may be anodized to form the oxide film. That is to say, the second fixing element 20 includes the aluminum material and the oxide film (alumina) located on the outer surface of the aluminum material.

Illustratively, the material of the protective layer includes yttrium oxide ($Y_2O_3$).

The electrode fixing assembly and the dry etching device provided in the embodiments of the present disclosure are described in detail above. The principle and implementations of the present disclosure are described in this specification by using specific examples. The description about the foregoing embodiments is merely provided to help understand the method and core ideas of the present disclosure. In addition, persons of ordinary skill in the art can make modifications in terms of the specific implementations and application scopes according to the ideas of the present disclosure. Therefore, the content of this specification shall not be construed as a limit to the present disclosure.

What is claimed is:

1. An electrode fixing assembly, comprising a first fixing element and a second fixing element, wherein a hardness of a material of the first fixing element is greater than a hardness of a material of the second fixing element, the first fixing element comprises a first transverse part and a first longitudinal part connected arranged crosswise with each other, and the second fixing element comprises a second transverse part and a second longitudinal part connected arranged crosswise with each other;

and wherein the electrode fixing assembly is configured to be arranged in a dry etching device to fix an upper electrode on a device body, the first fixing element and the second fixing element are arranged between the upper electrode and the device body, a side of the first fixing element away from the second fixing element is arranged towards the device body, and a side of the second fixing element away from the first fixing element is arranged towards the upper electrode.

2. The electrode fixing assembly in claim 1, wherein the material of the second fixing element comprises aluminum, and the material of the first fixing element comprises a metal material with a hardness greater than a hardness of the aluminum.

3. The electrode fixing assembly in claim 2, wherein the material of the first fixing element comprises at least one of iron, ferroalloy, tungsten, tungsten alloy, vanadium, vanadium alloy, manganese, manganese alloy, iridium, iridium alloy, molybdenum, molybdenum alloy, cobalt, cobalt alloy, zirconium, zirconium alloy, beryllium, beryllium alloy, titanium, titanium alloy, chromium, chromium alloy, tantalum, tantalum alloy, nickel, nickel alloy, niobium, and niobium alloy.

4. The electrode fixing assembly in claim 1, wherein a ratio of a thickness of the first fixing element to a thickness of the second fixing element is (1-5):(8-12).

5. The electrode fixing assembly in claim 1, wherein a protective layer is arranged on an outer surface of the second fixing element.

6. The electrode fixing assembly in claim 5, wherein a material of the protective layer comprises yttrium oxide.

7. The electrode fixing assembly in claim 1, wherein a first installation hole is defined on the first fixing element, a second installation hole is defined on the second fixing element, and the first installation hole is arranged corresponding to the second fixing installation hole.

8. The electrode fixing assembly in claim 1, wherein fourth installation holes are defined on the first fixing element, fifth installation holes are defined on the second fixing element, and the fourth installation holes are arranged corresponding to the fifth installation holes.

9. The electrode fixing assembly in claim 1, wherein a thickness of the first fixing element ranges from 1 mm to 5 mm.

10. The electrode fixing assembly in claim 1, wherein a thickness of the second fixing element ranges from 8 mm to 12 mm.

11. A dry etching device, comprising:

a device body, having an inner cavity;

an upper electrode, arranged in the inner cavity of the device body;

an electrode fixing assembly, comprising a first fixing element and a second fixing element, wherein a hardness of a material of the first fixing element is greater than a hardness of a material of the second fixing element, the first fixing element comprises a first transverse part and a first longitudinal part connected arranged crosswise with each other, and the second fixing element comprises a second transverse part and a second longitudinal part connected arranged crosswise with each other; and wherein the electrode fixing assembly is configured to be arranged in the dry etching device to fix an upper electrode on a device body, the first fixing element and the second fixing element are arranged between the upper electrode and the device body, a side of the first fixing element away from the second fixing element is arranged towards the device body, and a side of the second fixing element away from the first fixing element is arranged towards the upper electrode; the electrode fixing assembly is arranged in the inner cavity of the device body; and a lower electrode, arranged in the inner cavity of the device body, the lower electrode is arranged opposite to the upper electrode.

12. The dry etching device in claim 11, wherein a first installation hole is defined on the first fixing element, a second installation hole is defined on the second fixing element, and third installation holes are defined on the device body, the first installation hole and the second installation hole are arranged corresponding to the third installation holes, and the first fixing element, the second fixing element, and the device body are fixedly connected through first fasteners penetrating through the first installation hole, the second installation hole, and the third installation holes.

13. The dry etching device in claim 11, wherein fourth installation holes are defined on the first fixing element, fifth installation holes are defined on the second fixing element, and sixth installation holes are defined on the upper electrode, the fourth installation holes and the fifth installation holes are arranged corresponding to the sixth installation holes, and the first fixing element, the second fixing element, and the upper electrode are fixedly connected through second fasteners penetrating through the fourth installation holes, the fifth installation holes, and the sixth installation holes.

14. The dry etching device in claim 11, wherein the material of the second fixing element comprises aluminum, and the material of the first fixing element comprises a metal material with a hardness greater than a hardness of the aluminum.

15. The dry etching device in claim 14, wherein the material of the first fixing element comprises at least one of iron, ferroalloy, tungsten, tungsten alloy, vanadium, vanadium alloy, manganese, manganese alloy, iridium, iridium alloy, molybdenum, molybdenum alloy, cobalt, cobalt alloy, zirconium, zirconium alloy, beryllium, beryllium alloy, titanium, titanium alloy, chromium, chromium alloy, tantalum, tantalum alloy, nickel, nickel alloy, niobium, and niobium alloy.

16. The dry etching device in claim 11, wherein a ratio of a thickness of the first fixing element to a thickness of the second fixing element is (1-5):(8-12).

17. The dry etching device in claim 11, wherein a protective layer is arranged on an outer surface of the second fixing element.

18. The dry etching device in claim 17, wherein a material of the protective layer comprises yttrium oxide.

19. The dry etching device in claim 11, wherein a thickness of the first fixing element ranges from 1 mm to 5 mm.

20. The dry etching device in claim 11, wherein a thickness of the second fixing element ranges from 8 mm to 12 mm.

* * * * *